US012689378B2

(12) United States Patent
Bäumer et al.

(10) Patent No.: US 12,689,378 B2
(45) Date of Patent: Jul. 21, 2026

(54) IMPLEMENTING QUANTUM FAN-OUT OPERATION USING DYNAMIC QUANTUM CIRCUITS

(71) Applicant: International Business Machines Corporation, Armonk, NY (US)

(72) Inventors: Elisa Doreen Bäumer, Zurich (CH); Almudena Carrera Vazquez, Thalwil (CH); Daniel Josef Egger, Zurich (CH); Stefan Woerner, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/749,415

(22) Filed: Jun. 20, 2024

(65) Prior Publication Data

US 2025/0392313 A1      Dec. 25, 2025

(51) Int. Cl.
*H03K 19/195*      (2006.01)
*H03K 19/20*      (2006.01)
*H10N 69/00*      (2026.01)

(52) U.S. Cl.
CPC ........... *H03K 19/195* (2013.01); *H03K 19/20* (2013.01); *H10N 69/00* (2023.02)

(58) Field of Classification Search
CPC ....... H03K 19/195; H03K 19/20; H10N 69/00
USPC ........................................................ 326/1, 7
See application file for complete search history.

(56) References Cited

U.S. PATENT DOCUMENTS

| | | | |
|---|---|---|---|
| 2020/0242208 A1 | 7/2020 | Daraeizadeh et al. | |
| 2023/0196156 A1* | 6/2023 | Chen ...................... | G06N 10/20 |
| | | | 706/62 |
| 2023/0396254 A1 | 12/2023 | Szady | |
| 2023/0401474 A1 | 12/2023 | Soeken et al. | |
| 2024/0062087 A1 | 2/2024 | Chaplin et al. | |

FOREIGN PATENT DOCUMENTS

CN            117313878 A      12/2023

OTHER PUBLICATIONS

Olvia Di Matteo, "Bounded Depth Quantum Circuits," glassnotes. github.io, Jul. 17, 2014, pp. 1-17.
Buhrman et al., "State Preparation by Shallow Circuits Using Feed Forward," arXiv:2307.14840v1, Jul. 27, 2023, pp. 1-35.

(Continued)

*Primary Examiner* — Arnold M Kinkead
(74) *Attorney, Agent, or Firm* — Samuel A. Waldbaum

(57)            ABSTRACT

A method, system, and computer program product for implementing a quantum fan-out operation. A fan-out gate is constructed using ladders of CNOT gates in a constant depth using a dynamic quantum circuit. Constant depth refers to the depth or number of time steps being independent of the number of qubits. A dynamic quantum circuit is a quantum circuit with mid-circuit measurements and feed-forward classical operations which allows such circuits to be adaptive on-the-fly. The quantum fan-out operation is implemented by the fan-out gate using ancilla qubits and feed-forward operations. In this manner, the quantum fan-out operation can be implemented on superconducting devices at a reduced depth (constant depth) with fewer CNOT gates as well as using fewer ancilla qubits.

20 Claims, 11 Drawing Sheets

(56) References Cited

OTHER PUBLICATIONS

Guo et al., "Implementing a Fast Unbounded Quantum Fanout Gate Using Power-Law Interactions," Physical Review Research, vol. 4, No. L042016, 2022, pp. 1-6.
Baumer et al., "Quantum Fourier Transform Using Dynamic Circuits," arXiv:2403.09514v2, Mar. 27, 2024, pp. 1-9.
Richard Jozsa, "An Introduction to Measurement Based Quantum Computation," arXiv:quant-ph/0508124v2, Sep. 20, 2005, pp. 1-22.
Baumer et al., "Efficient Long-Range Entanglement Using Dynamic Circuits", arXiv:2308.13065v2 [quant-ph] Sep. 8, 2024, 21 pages.
Hoyer et al., "Quantum Fan-Out is Powerful", arXiv:quant-ph/0208043v4 May 18, 2005, 20 pages.
Mølmer et al., "Multiparticle Entanglement of Hot Trapped Ions", Phys. Rev. Lett., 82:1835-1838, 1999.

\* cited by examiner

1000

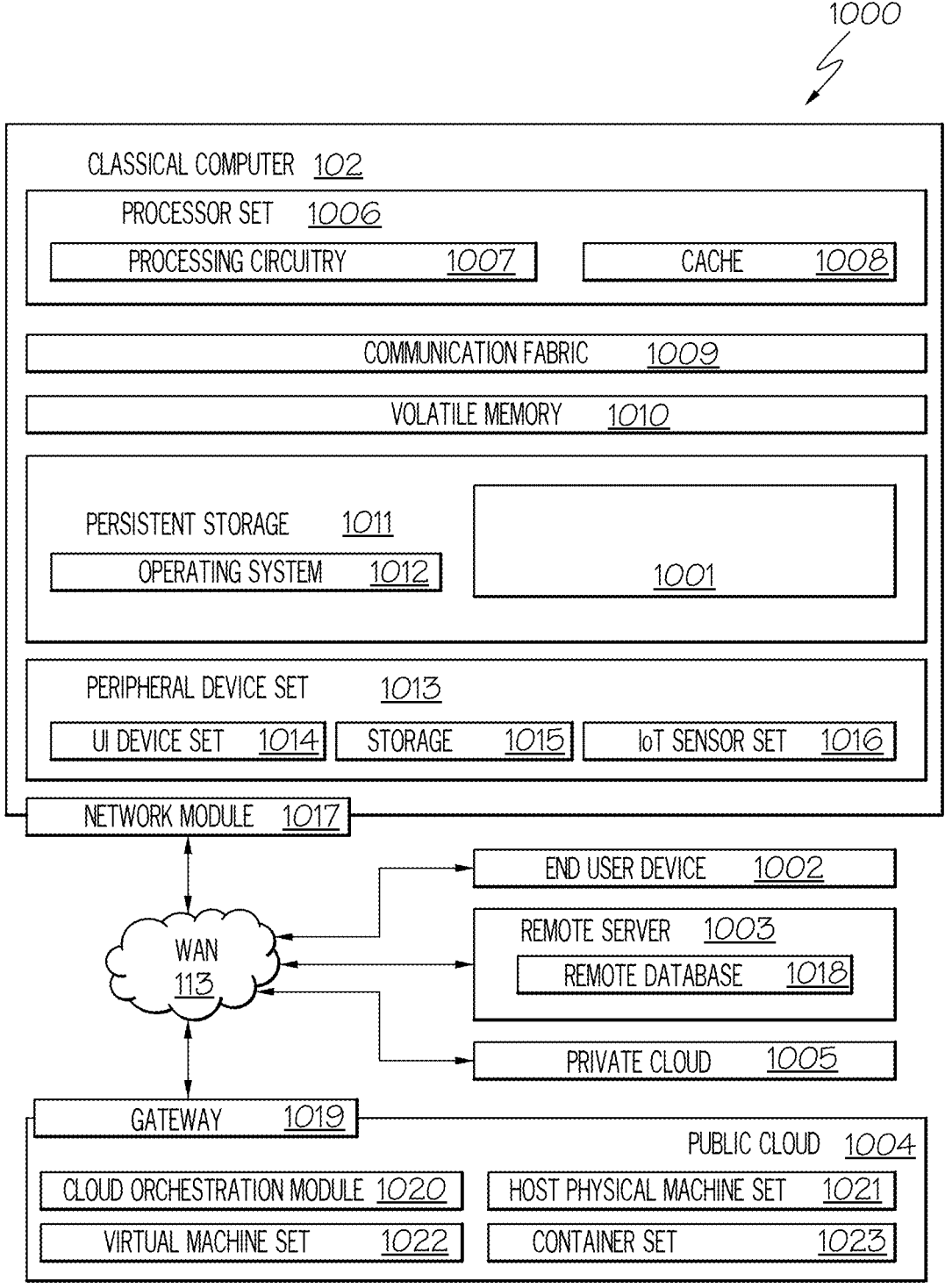

CLASSICAL COMPUTER  102

PROCESSOR SET    1006

PROCESSING CIRCUITRY    1007          CACHE    1008

COMMUNICATION FABRIC    1009

VOLATILE MEMORY    1010

PERSISTENT STORAGE    1011

OPERATING SYSTEM    1012

1001

PERIPHERAL DEVICE SET    1013

UI DEVICE SET    1014      STORAGE    1015      IoT SENSOR SET    1016

NETWORK MODULE    1017

WAN
113

END USER DEVICE    1002

REMOTE SERVER    1003

REMOTE DATABASE    1018

PRIVATE CLOUD    1005

GATEWAY    1019

PUBLIC CLOUD    1004

CLOUD ORCHESTRATION MODULE    1020      HOST PHYSICAL MACHINE SET    1021

VIRTUAL MACHINE SET    1022      CONTAINER SET    1023

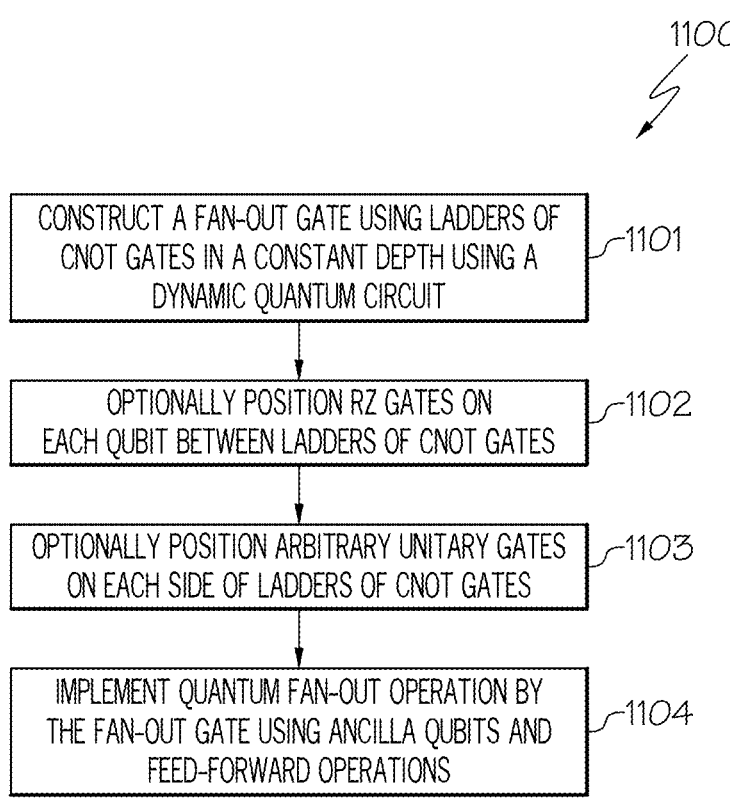

CONSTRUCT A FAN-OUT GATE USING LADDERS OF
CNOT GATES IN A CONSTANT DEPTH USING A
DYNAMIC QUANTUM CIRCUIT ⌐1101

OPTIONALLY POSITION RZ GATES ON
EACH QUBIT BETWEEN LADDERS OF CNOT GATES ⌐1102

OPTIONALLY POSITION ARBITRARY UNITARY GATES
ON EACH SIDE OF LADDERS OF CNOT GATES ⌐1103

IMPLEMENT QUANTUM FAN-OUT OPERATION BY
THE FAN-OUT GATE USING ANCILLA QUBITS AND
FEED-FORWARD OPERATIONS ⌐1104

FIG. 11

IMPLEMENTING QUANTUM FAN-OUT OPERATION USING DYNAMIC QUANTUM CIRCUITS

TECHNICAL FIELD

The present disclosure relates generally to the quantum fan-out operation, and more particularly to implementing the quantum fan-out operation using dynamic quantum circuits.

BACKGROUND

The quantum fan-out operation performed by quantum fan-out gates refers to having a sequence of controlled-NOT (CNOT) gates sharing one control qubit that can be executed at the same time. The CNOT gate operates on a quantum register consisting of 2 qubits. The CNOT gate flips the second qubit (the target qubit) if and only if the first qubit (the control qubit) is $|1\rangle$. Such an operation is called fan-out because if all target qubits are zero, then the gate copies the classical source bit into n copies.

Applications of quantum fan-out include arithmetic operations, such as addition, OR, and modulus. Furthermore, quantum fan-out can be very powerful for various quantum algorithms and subroutines.

Currently, the quantum fan-out operation may be implemented on quantum computing platforms by trapped ions, which offer the possibility to natively implement a fan-out gate. Unfortunately, such a technique is not applicable for superconducting devices.

A current technique for implementing the quantum fan-out operation on superconducting devices constructs the quantum fan-out gate using costly ladders of CNOT gates (vertical structures of CNOT gates) with a depth (measure of how many layers of parallel operations need to be executed) linear in n, the number of qubits.

If, however, the depth of the quantum fan-out gate could be reduced, such as to a constant depth (the depth or number of time steps is independent of the number of qubits), with fewer CNOT gates, then quantum fan-out becomes more feasible on superconducting devices thereby enabling the quantum fan-out operation to be utilized in state preparation, Hamiltonian simulation, quantum machine learning, and error correction as well as in additional quantum algorithms, such as quantum Fourier transform, quantum phase estimation, the increment gate, and sorting.

SUMMARY

In one embodiment of the present disclosure, a method for implementing a quantum fan-out operation comprises constructing a fan-out gate using ladders of CNOT gates in a constant depth using a dynamic quantum circuit. The method further comprises implementing the quantum fan-out operation by the fan-out gate using ancilla qubits and feed-forward operations.

Additionally, in one embodiment of the present disclosure, the fan-out gate is constructed from two ladders of CNOT gates.

Furthermore, in one embodiment of the present disclosure, the method additionally comprises positioning RZ gates on each qubit between the ladders of CNOT gates thereby applying fan-out with RZZ operations.

Additionally, in one embodiment of the present disclosure, the method further comprises positioning arbitrary unitary gates between the ladders of CNOT gates thereby applying fan-out with arbitrary single-qubit unitaries.

Furthermore, in one embodiment of the present disclosure, the method additionally comprises implementing the quantum fan-out operation by the fan-out gate in one round of mid-circuit measurement of the dynamic quantum circuit using 3n ancilla qubits, where n is a number of qubits.

Additionally, in one embodiment of the present disclosure, the method further comprises implementing the quantum fan-out operation by the fan-out gate in two rounds of mid-circuit measurements of the dynamic quantum circuit using n ancilla qubits, where n is a number of qubits.

Furthermore, in one embodiment of the present disclosure, the dynamic quantum circuit has a depth that does not scale with a number of qubits.

Other forms of the embodiments of the method described above are in a system and in a computer program product.

Accordingly, embodiments of the present disclosure implement the quantum fan-out operation on superconducting devices (superconducting qubits) by reducing the depth of the quantum fan-out gate to a constant depth (the depth or number of time steps is independent of the number of qubits) with fewer CNOT gates and using fewer ancilla qubits thereby enabling the quantum fan-out operation to be utilized in state preparation, Hamiltonian simulation, quantum machine learning, and error correction as well as in additional quantum algorithms, such as quantum Fourier transform, quantum phase estimation, the increment gate, and sorting.

The foregoing has outlined rather generally the features and technical advantages of one or more embodiments of the present disclosure in order that the detailed description of the present disclosure that follows may be better understood. Additional features and advantages of the present disclosure will be described hereinafter which may form the subject of the claims of the present disclosure.

BRIEF DESCRIPTION OF THE DRAWINGS

A better understanding of the present disclosure can be obtained when the following detailed description is considered in conjunction with the following drawings, in which:

FIG. 10 illustrates an embodiment of the present disclosure of the hardware configuration of the classical computer which is representative of a hardware environment for practicing the present disclosure; and FIG. 11 is a flowchart of a method for implementing the quantum fan-out operation on superconducting devices (superconducting qubits) in accordance with an embodiment of the present disclosure.

DETAILED DESCRIPTION

Figure 1:
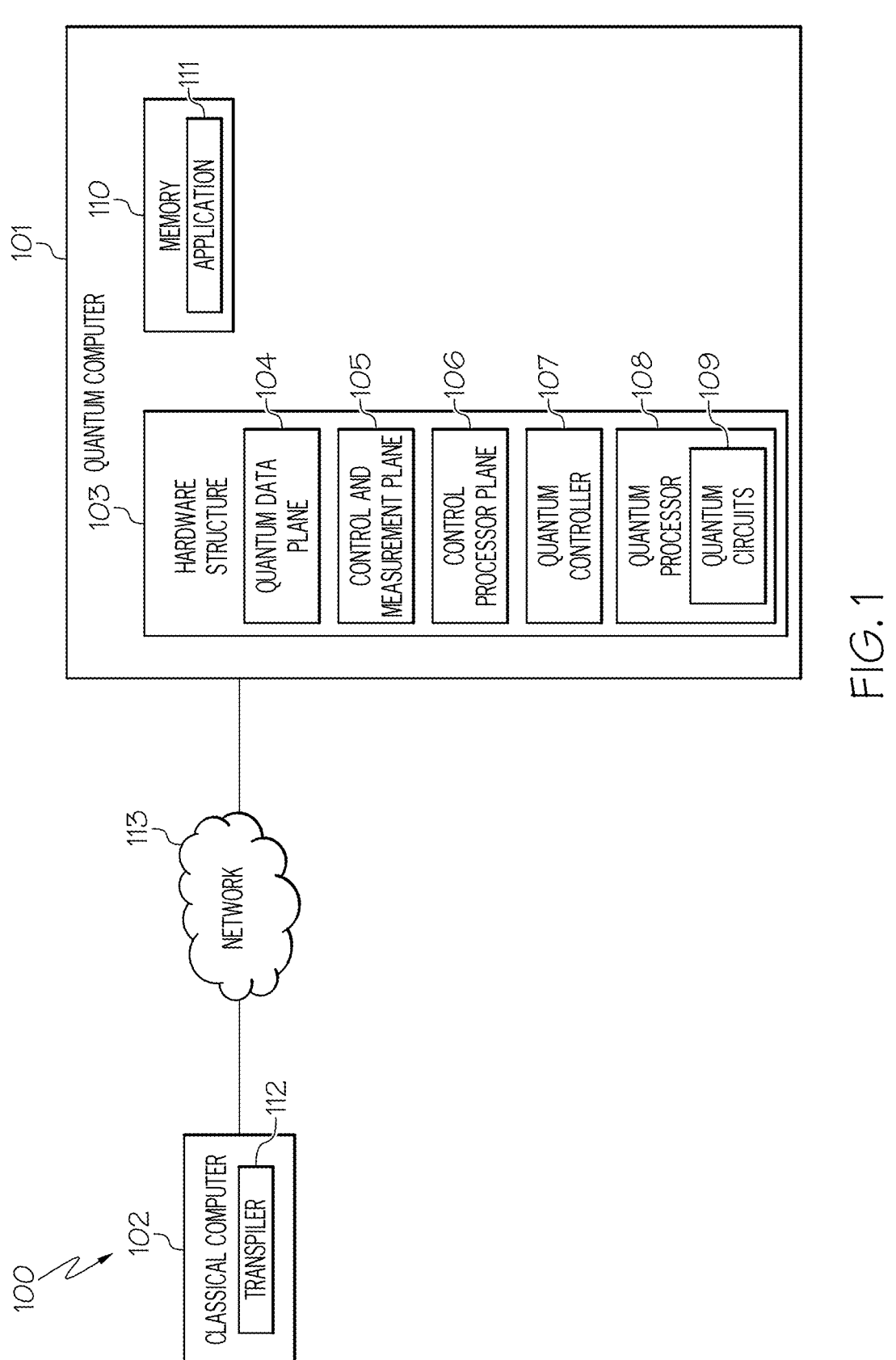
FIG. 1 illustrates a communication system for practicing the principles of the present disclosure in accordance with an embodiment of the present disclosure.

In one embodiment of the present disclosure, a method for implementing a quantum fan-out operation comprises constructing a fan-out gate using ladders of CNOT gates in a constant depth using a dynamic quantum circuit. The method further comprises implementing the quantum fan-out operation by the fan-out gate using ancilla qubits and feed-forward operations.

In this manner, the quantum fan-out operation is implemented on superconducting devices (superconducting qubits) by reducing the depth of the quantum fan-out gate to a constant depth (the depth or number of time steps is independent of the number of qubits) with fewer CNOT gates and using fewer ancilla qubits thereby enabling the quantum fan-out operation to be utilized in state preparation, Hamiltonian simulation, quantum machine learning, and error correction as well as in additional quantum algorithms, such as quantum Fourier transform, quantum phase estimation, the increment gate, and sorting.

Additionally, in one embodiment of the present disclosure, the fan-out gate is constructed from two ladders of CNOT gates.

In this manner, an unbounded fan-out gate can be constructed from two CNOT ladders.

Furthermore, in one embodiment of the present disclosure, the method additionally comprises positioning RZ gates on each qubit between the ladders of CNOT gates thereby applying fan-out with RZZ operations.

In this manner, fan-out can be applied with multi-qubit rotations.

Additionally, in one embodiment of the present disclosure, the method further comprises positioning arbitrary unitary gates between the ladders of CNOT gates thereby applying fan-out with arbitrary single-qubit unitaries.

In this manner, fan-out can be applied with arbitrary single-qubit unitaries.

Furthermore, in one embodiment of the present disclosure, the method additionally comprises implementing the quantum fan-out operation by the fan-out gate in one round of mid-circuit measurement of the dynamic quantum circuit using 3n ancilla qubits, where n is a number of qubits.

In this manner, the quantum fan-out operation can be performed using only a single round of a mid-circuit measurement of the dynamic quantum circuit.

Additionally, in one embodiment of the present disclosure, the method further comprises implementing the quantum fan-out operation by the fan-out gate in two rounds of mid-circuit measurements of the dynamic quantum circuit using n ancilla qubits, where n is a number of qubits.

In this manner, the quantum fan-out operation can be performed using two rounds of mid-circuit measurements of the dynamic quantum circuit.

Furthermore, in one embodiment of the present disclosure, the dynamic quantum circuit has a depth that does not scale with a number of qubits.

In this manner, the depth of the quantum fan-out gate is reduced to a constant depth.

Other forms of the embodiments of the method described above are in a system and in a computer program product.

As stated above, applications of quantum fan-out include fault-tolerant applications include arithmetic operations, such as addition, OR, and modulus. Furthermore, quantum fan-out can be very powerful for various quantum algorithms and subroutines.

Currently, the quantum fan-out operation may be implemented on quantum computing platforms by trapped ions, which offer the possibility to natively implement a fan-out gate. Unfortunately, such a technique is not applicable for superconducting devices.

A current technique for implementing the quantum fan-out operation on superconducting devices constructs the quantum fan-out gate using costly ladders of CNOT gates (vertical structures of CNOT gates) with a depth (measure of how many layers of parallel operations need to be executed) linear in n, the number of qubits.

If, however, the depth of the quantum fan-out gate could be reduced, such as to a constant depth (the depth or number of time steps is independent of the number of qubits), with fewer CNOT gates, then quantum fan-out becomes more feasible on superconducting devices thereby enabling the quantum fan-out operation to be utilized in state preparation, Hamiltonian simulation, quantum machine learning, and error correction as well as in additional quantum algorithms, such as quantum Fourier transform, quantum phase estimation, the increment gate, and sorting.

The embodiments of the present disclosure provide the means for implementing the quantum fan-out operation on superconducting devices by reducing the depth of the quantum fan-out gate to a constant depth (the depth or number of time steps is independent of the number of qubits) with fewer CNOT gates by using dynamic quantum circuits (or simply referred to herein as "dynamic circuits"). A quantum fan-out operation, as used herein, is a sequence of controlled-NOT (CNOT) gates sharing one control qubit that can be executed at the same time. A dynamic quantum circuit, as used herein, is a quantum circuit with mid-circuit measurements and feed-forward classical operations which allows such circuits to be adaptive on-the-fly. A mid-circuit measurement, as used herein, is a quantum measurement at an intermediate point in the quantum circuit as opposed to a measurement at the end point of the quantum circuit thereby allowing dynamic adaptations based on the results. Feed-forward classical operations (or simply referred to herein as "feed-forward operations"), as used herein, refer to the real-time adaptation of the quantum circuits based on earlier measurement outcomes. In one embodiment, a fan-out gate is constructed in a constant depth using a dynamic quantum circuit, such as by using ladders of CNOT gates. Constant depth, as used herein, refers to the depth or number of time steps being independent of the number of qubits. Furthermore, in one embodiment, fan-out is applied with RZZ operations by positioning RZ gates on each qubit between the ladders of the CNOT gates. Additionally, in one embodiment, fan-out is applied with arbitrary single-qubit unitaries by positioning arbitrary unitary gates between the ladders of the CNOT gates. The quantum fan-out operation is then implemented by the fan-out gate using ancilla qubits, such as n ancilla qubits corresponding to the number of qubits, and feed-forward operations. In this manner, the quantum fan-out operation can be implemented on superconducting devices at a reduced depth (constant depth) with fewer CNOT gates than previous implementations in constant depth as well as using fewer ancilla qubits. These and other features will be discussed in further detail below.

In some embodiments of the present disclosure, the present disclosure comprises a method, system, and computer program product for implementing a quantum fan-out operation. In one embodiment of the present disclosure, a fan-out gate is constructed in a constant depth using a dynamic quantum circuit, such as by using ladders of CNOT gates. Constant depth, as used herein, refers to the depth or number of time steps being independent of the number of qubits. A dynamic quantum circuit, as used herein, is a quantum circuit with mid-circuit measurements and feed-forward classical operations which allows such circuits to be adaptive on-the-fly. The quantum fan-out operation is implemented by the fan-out gate using ancilla qubits and feed-forward operations. In this manner, the quantum fan-out operation can be implemented on superconducting devices at a reduced depth (constant depth) with fewer CNOT gates as well as using fewer ancilla qubits.

In the following description, numerous specific details are set forth to provide a thorough understanding of the present disclosure. However, it will be apparent to those skilled in the art that the present disclosure may be practiced without such specific details. In other instances, well-known circuits have been shown in block diagram form in order not to obscure the present disclosure in unnecessary detail. For the most part, details considering timing considerations and the like have been omitted inasmuch as such details are not necessary to obtain a complete understanding of the present disclosure and are within the skills of persons of ordinary skill in the relevant art.

Referring now to the Figures in detail, FIG. 1 illustrates an embodiment of the present disclosure of a communication system 100 for practicing the principles of the present disclosure. Communication system 100 includes a quantum computer 101 configured to perform quantum computations, such as the types of computations that harness the collective properties of quantum states, such as superposition, interference, and entanglement, as well as a classical computer 102 in which information is stored in bits that are represented logically by either a 0 (off) or a 1 (on). Examples of classical computer 102 include, but are not limited to, a portable computing unit, a Personal Digital Assistant (PDA), a laptop computer, a mobile device, a tablet personal computer, a smartphone, a mobile phone, a navigation device, a gaming unit, a desktop computer system, a workstation, and the like configured with the capability of connecting to network 113 (discussed below).

In one embodiment, classical computer 102 is used to set up the state of quantum bits in quantum computer 101 and then quantum computer 101 starts the quantum process. Furthermore, in one embodiment, classical computer 102 is configured to implement quantum fan-out operations on superconducting devices at a reduced depth (constant depth) with fewer CNOT gates using dynamic quantum circuits as discussed further below.

In one embodiment, a hardware structure 103 of quantum computer 101 includes a quantum data plane 104, a control and measurement plane 105, a control processor plane 106, a quantum controller 107, and a quantum processor 108. While depicted as being located on a single machine, quantum data plane 104, control and measurement plane 105, and control processor plane 106 may be distributed across multiple computing machines, such as in a cloud computing architecture, and communicate with quantum controller 107, which may be located in close proximity to quantum processor 108.

Quantum data plane 104 includes the physical qubits or quantum bits (basic unit of quantum information in which a qubit is a two-state (or two-level) quantum-mechanical system) and the structures needed to hold them in place. In one embodiment, quantum data plane 104 contains any support circuitry needed to measure the qubits' state and perform gate operations on the physical qubits for a gate-based system or control the Hamiltonian for an analog computer. In one embodiment, control signals routed to the selected qubit(s) set a state of the Hamiltonian. For gate-based systems, since some qubit operations require two qubits, quantum data plane 104 provides a programmable "wiring" network that enables two or more qubits to interact.

Control and measurement plane 105 converts the digital signals of quantum controller 107, which indicates what quantum operations are to be performed, to the analog control signals needed to perform the operations on the qubits in quantum data plane 104. In one embodiment, control and measurement plane 105 converts the analog output of the measurements of qubits in quantum data plane 104 to classical binary data that quantum controller 107 can handle.

Control processor plane 106 identifies and triggers the sequence of quantum gate operations and measurements (which are subsequently carried out by control and measurement plane 105 on quantum data plane 104). These sequences execute the program, provided by quantum processor 108, for implementing a quantum algorithm.

In one embodiment, control processor plane 106 runs the quantum error correction algorithm (if quantum computer 101 is error corrected).

In one embodiment, quantum processor 108 uses qubits to perform computational tasks. In the particular realms where quantum mechanics operate, particles of matter can exist in multiple states, such as an "on" state, an "off" state, and both "on" and "off" states simultaneously. Quantum processor 108 harnesses these quantum states of matter to output signals that are usable in data computing.

In one embodiment, quantum processor 108 performs algorithms which conventional processors are incapable of performing efficiently.

In one embodiment, quantum processor 108 includes one or more quantum circuits 109. Quantum circuits 109 may collectively or individually be referred to as quantum circuits 109 or quantum circuit 109, respectively. A "quantum circuit 109," as used herein, refers to a model for quantum computation in which a computation is a sequence of quantum logic gates, measurements, initializations of qubits to known values and possibly other actions. A "quantum logic gate," as used herein, is a reversible unitary transformation on at least one qubit. Quantum logic gates, in contrast to classical logic gates, are all reversible. Examples of quantum logic gates include RX (performs $e^{i\theta X/2}$, which corresponds to a rotation of the qubit state around the X-axis by the given angle theta $\theta$ on the Bloch sphere), RY (performs $e^{i\theta Y/2}$, which corresponds to a rotation of the qubit state around the Y-axis by the given angle theta $\theta$ on the Bloch sphere), RXX (performs the operation $e^{(-i\theta X \otimes X/2)}$ on the input qubit), RZZ (takes in one input, an angle theta $\theta$ expressed in radians, and it acts on two qubits), etc. In one embodiment, quantum circuits 109 are written such that the horizontal axis is time, starting at the left-hand side and ending at the right-hand side.

Furthermore, in one embodiment, quantum circuit 109 corresponds to a command structure provided to control processor plane 106 on how to operate control and measurement plane 105 to run the algorithm on quantum data plane 104/quantum processor 108.

Furthermore, quantum computer 101 includes memory 110, which may correspond to quantum memory. In one embodiment, memory 110 is a set of quantum bits that store quantum states for later retrieval. The state stored in quantum memory 110 can retain quantum superposition.

In one embodiment, memory 110 stores an application 111 that may be configured to implement one or more of the methods described herein in accordance with one or more embodiments. For example, application 111 may implement a program for implementing quantum fan-out operations on superconducting devices at a reduced depth (constant depth) with fewer CNOT gates using dynamic quantum circuits as discussed further below in connection with FIGS. 2-9 and 11. Examples of memory 110 include light quantum memory, solid quantum memory, gradient echo memory, electromagnetically induced transparency, etc.

Furthermore, in one embodiment, classical computer 102 includes a "transpiler 112," which as used herein, is configured to rewrite an abstract quantum circuit 109 into a functionally equivalent one that matches the constraints and characteristics of a specific target quantum device. In one embodiment, transpiler 112 (e.g., qiskit.transpiler, where Qiskit® is an open-source software development kit for working with quantum computers at the level of circuits, pulses, and algorithms) rewrites a given input circuit to match the topology of a specific quantum device and/or to optimize the quantum circuit for execution. In one embodiment, transpiler 112 converts a trained machine learning model upon execution on quantum hardware 103 to its elementary instructions and maps it to physical qubits.

In one embodiment, quantum machine learning models are based on variational quantum circuits 109. Such models consist of data encoding, processing parameterized with trainable parameters, and measurement/post-processing.

In one embodiment, the number of qubits (basic unit of quantum information in which a qubit is a two-state (or two-level) quantum-mechanical system) is determined by the number of features in the data. This processing stage may include multiple layers of parameterized gates. As a result, in one embodiment, the number of trainable parameters is (number of features)*(number of layers).

Furthermore, as shown in FIG. 1, classical computer 102, which is used to set up the state of quantum bits in quantum computer 101, may be connected to quantum computer 101 via network 113.

Network 113 may be, for example, a quantum network, a local area network, a wide area network, a wireless wide area network, a circuit-switched telephone network, a Global System for Mobile Communications (GSM) network, a Wireless Application Protocol (WAP) network, a WiFi network, an IEEE 802.11 standards network, a cellular network and various combinations thereof, etc. Other networks, whose descriptions are omitted here for brevity, may also be used in conjunction with system 100 of FIG. 1 without departing from the scope of the present disclosure.

Furthermore, classical computer 102 is configured to implement quantum fan-out operations on superconducting devices at a reduced depth (constant depth) with fewer CNOT gates using dynamic quantum circuits as discussed further below in connection with FIGS. 2-9 and 11. A description of the software components of classical computer 102 is provided below in connection with FIG. 2 and a description of the hardware configuration of classical computer 102 is provided further below in connection with FIG. 10.

System 100 is not to be limited in scope to any one particular network architecture. System 100 may include any number of quantum computers 101, classical computers 102, and networks 113.

A discussion regarding the software components used by classical computer 102 for implementing quantum fan-out operations on superconducting devices at a reduced depth (constant depth) with fewer CNOT gates using dynamic quantum circuits is provided below in connection with FIG. 2.

Figure 2:
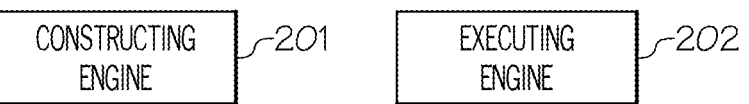
FIG. 2 is a diagram of the software components of the classical computer for implementing quantum fan-out operations on superconducting devices at a reduced depth (constant depth) with fewer CNOT gates using dynamic quantum circuits in accordance with an embodiment of the present disclosure.

FIG. 2 is a diagram of the software components of classical computer 102 (FIG. 1) for implementing quantum fan-out operations on superconducting devices at a reduced depth (constant depth) with fewer CNOT gates using dynamic quantum circuits in accordance with an embodiment of the present disclosure.

Referring to FIG. 2, in conjunction with FIG. 1, classical computer 102 includes constructing engine 201 configured to construct a fan-out gate using ladders of CNOT gates in a constant depth using a dynamic quantum circuit. A "fan-out gate," as used herein, refers to a sequence of CNOT gates sharing one control qubit that can be executed at the same time. "Constant depth," as used herein, refers to the depth or number of time steps being independent of the number of qubits. A dynamic quantum circuit, as used herein, is a quantum circuit with mid-circuit measurements and feed-forward classical operations which allows such circuits to be adaptive on-the-fly. A mid-circuit measurement, as used herein, is a quantum measurement at an intermediate point in the quantum circuit as opposed to a measurement at the end point of the quantum circuit thereby allowing dynamic adaptations based on the results. Feed-forward classical operations (or simply referred to herein as "feed-forward operations"), as used herein, refer to the real-time adaptation of the quantum circuits based on earlier measurement outcomes.

Figures 3A, 3B, 3C:
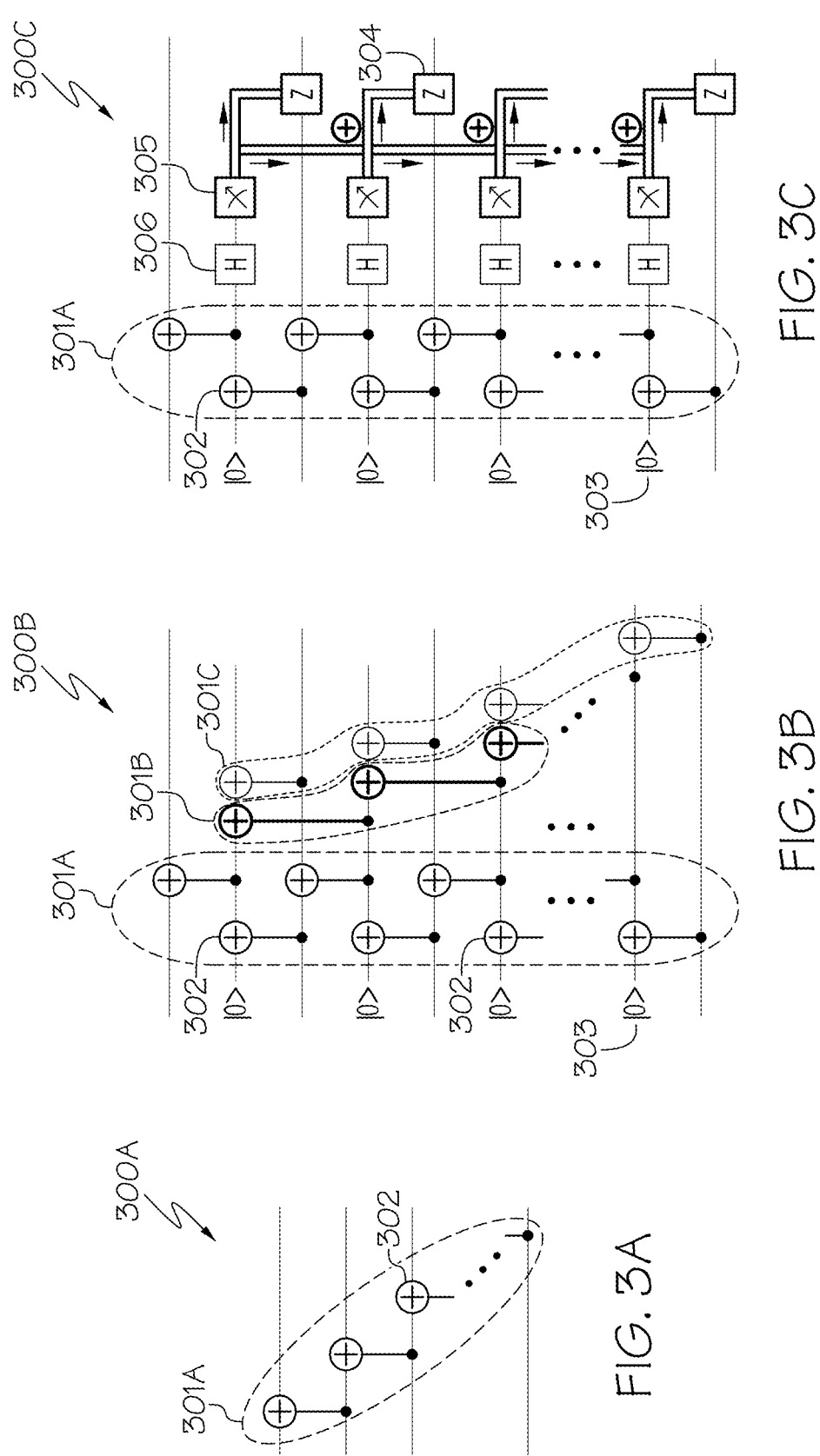
FIGS. 3A-3C illustrate constructing CNOT ladders in constant depth in accordance with an embodiment of the present disclosure.

A "ladder" of CNOT gates refers to a diagonal structure of CNOT gates that has a depth of n, where n is the number of qubits in the ladder of CNOT gates as illustrated in FIGS. 3A-3C. Embodiments of the present disclosure execute such ladders of CNOT gates with dynamic circuits in a depth that does not scale with n resulting in a vertical structure which is more advantageous. Ancilla qubits, as used herein, refer to the extra qubits used to implement irreversible logical operations. For example, when translating a classical circuit into a quantum circuit, extra qubits are introduced because quantum computers only implement reversible logic. Such extra qubits are referred to as "ancilla" (or ancillary) qubits.

FIGS. 3A-3C illustrate constructing CNOT ladders in constant depth in accordance with an embodiment of the present disclosure.

Referring to FIG. 3A, FIG. 3A illustrates a quantum circuit 300A containing a ladder 301A of CNOT gates 302, where each CNOT gate 302 operates on a quantum register consisting of 2 qubits. CNOT gates 302 may collectively or individually be referred to as CNOT gates 302 or CNOT gate 302, respectively. The CNOT gate flips the second qubit (the target qubit) if and only if the first qubit (the control qubit) is |1⟩.

FIG. 3B illustrates a quantum circuit 300B that includes three ladders 301A-301C of CNOT gates 302. Ladders 301A-301C of CNOT gates 302 may collectively or individually be referred to as ladders 301 of CNOT gates 302 or ladder 301 of CNOT gates 302, respectively.

FIG. 3C illustrates a dynamic quantum circuit 300C that measures ancilla qubits 303 in the X-basis (particular qubit computational basis state) and feed-forward Z-gates 304 based on the outcome of all ancilla qubits 303 using measurement operations 305. In the X-basis, the qubit eigenstates states are $|+\rangle$ and $|-\rangle$. Furthermore, as illustrated in FIG. 3C, dynamic quantum circuit 300C includes Hadamard gates 306, which are logic gates that turn a state of $|0\rangle$ or $|1\rangle$ into a superposition of $|0\rangle$ and $|1\rangle$. While FIG. 3C illustrates dynamic quantum circuit 300C measuring ancilla qubits 303 in the X-basis, such a dynamic quantum circuit may be modified to measure ancilla qubits 303 in other basis states, such as the Z-basis, such as by exchanging the Z-basis with the X-basis. In the Z-basis, the qubit eigenstates are the states $|0\rangle$ and $|1\rangle$.

As discussed above, a fan-out gate may be constructed from ladders 301 of CNOT gates 302, such as shown in FIGS. 4A-4D.

FIGS. 4A-4D illustrate constructing a fan-out gate from CNOT ladders in accordance with an embodiment of the present disclosure.

Figure 4C:
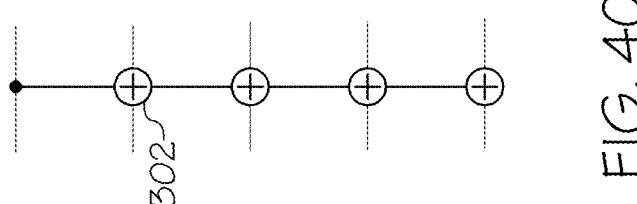
FIGS. 4A-4D illustrate constructing a fan-out gate from CNOT ladders in accordance with an embodiment of the present disclosure.
Figure 4B:
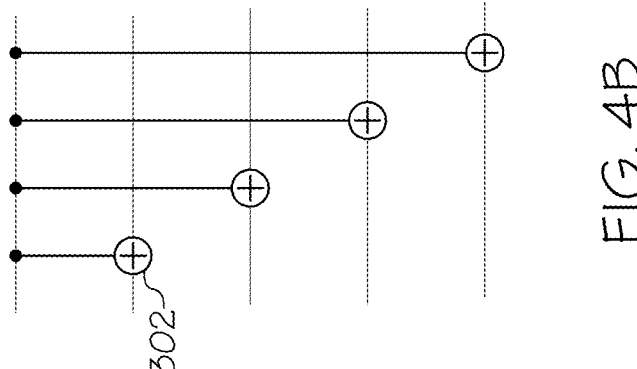
Figure 4A:
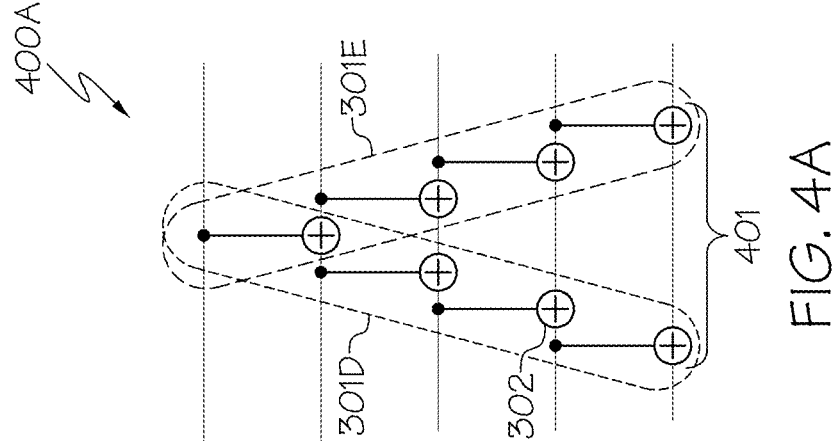

Referring to FIG. 4A, FIG. 4A illustrates two ladders 301D-301E of CNOT gates 302 of a dynamic quantum circuit 400A forming fan-out gate 401, which are configured similarly to ladders 301A-301C. Ladders 301D-301E may collectively or individually be referred to as ladders 301 or ladder 301, respectively.

Figure 4D:
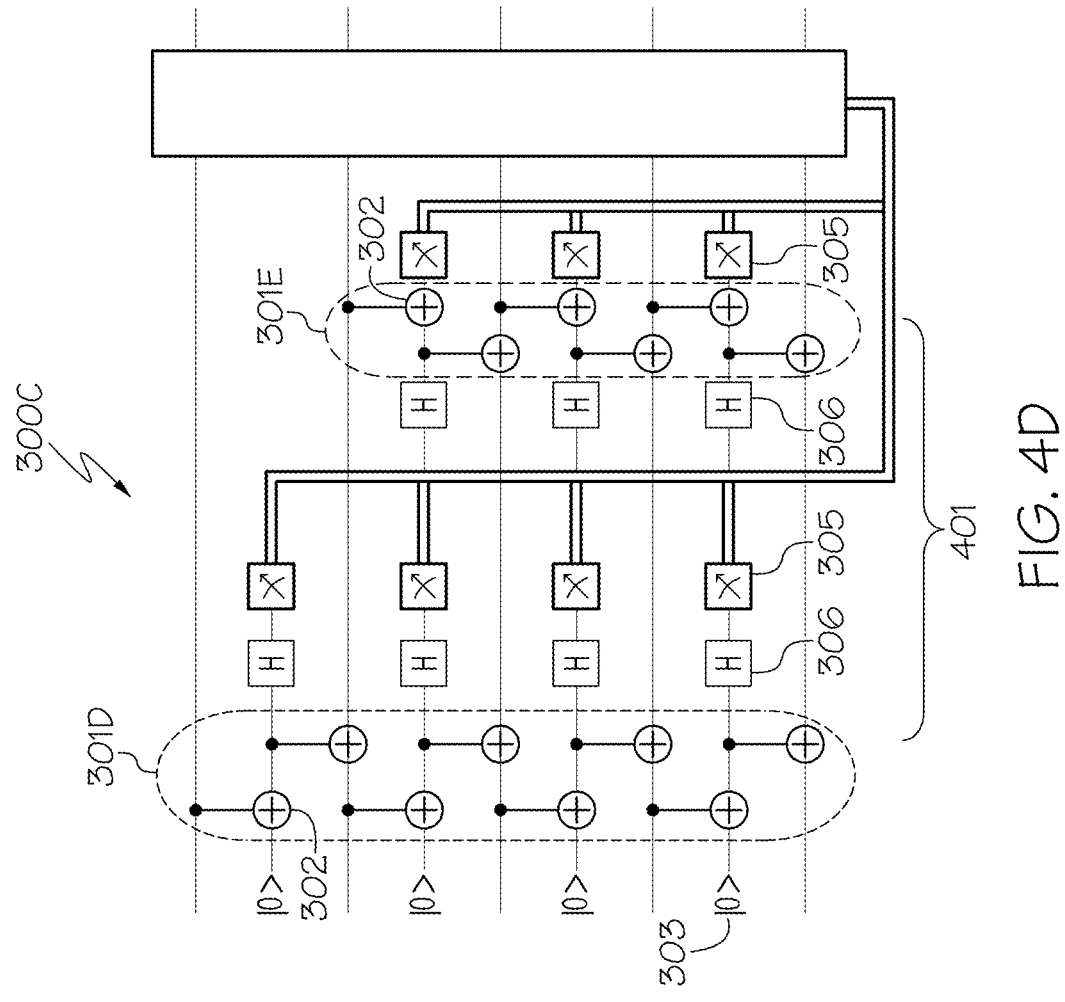

Such ladders 301D-301E of CNOT gates 302 may be redrawn as shown in FIGS. 4B and 4C, which are used to construct fan-out gate 401 of a dynamic quantum circuit 400B of FIG. 4D, which consists of ladders 301D-301E of CNOT gates 302. Furthermore, as illustrated in FIG. 4D, the quantum fan-out operation is performed by fan-out gate 401 involving strategically positioned measurement operations 305 and Hadamard gates 306 using ancilla qubits 303.

Furthermore, in one embodiment, by adding an additional ladder 301 of CNOT gates 302 on the qubits to not be utilized by the fan-out gate (e.g., fan-out gate 401), such qubits can be disregarded by the fan-out gate.

In one embodiment, the quantum fan-out operation is implemented by the fan-out gate (e.g., fan-out gate 401) in two rounds of mid-circuit measurements of the dynamic quantum circuit (e.g., dynamic quantum circuit 400B) using n ancilla qubits 303, where n is the number of qubits.

Figure 5:
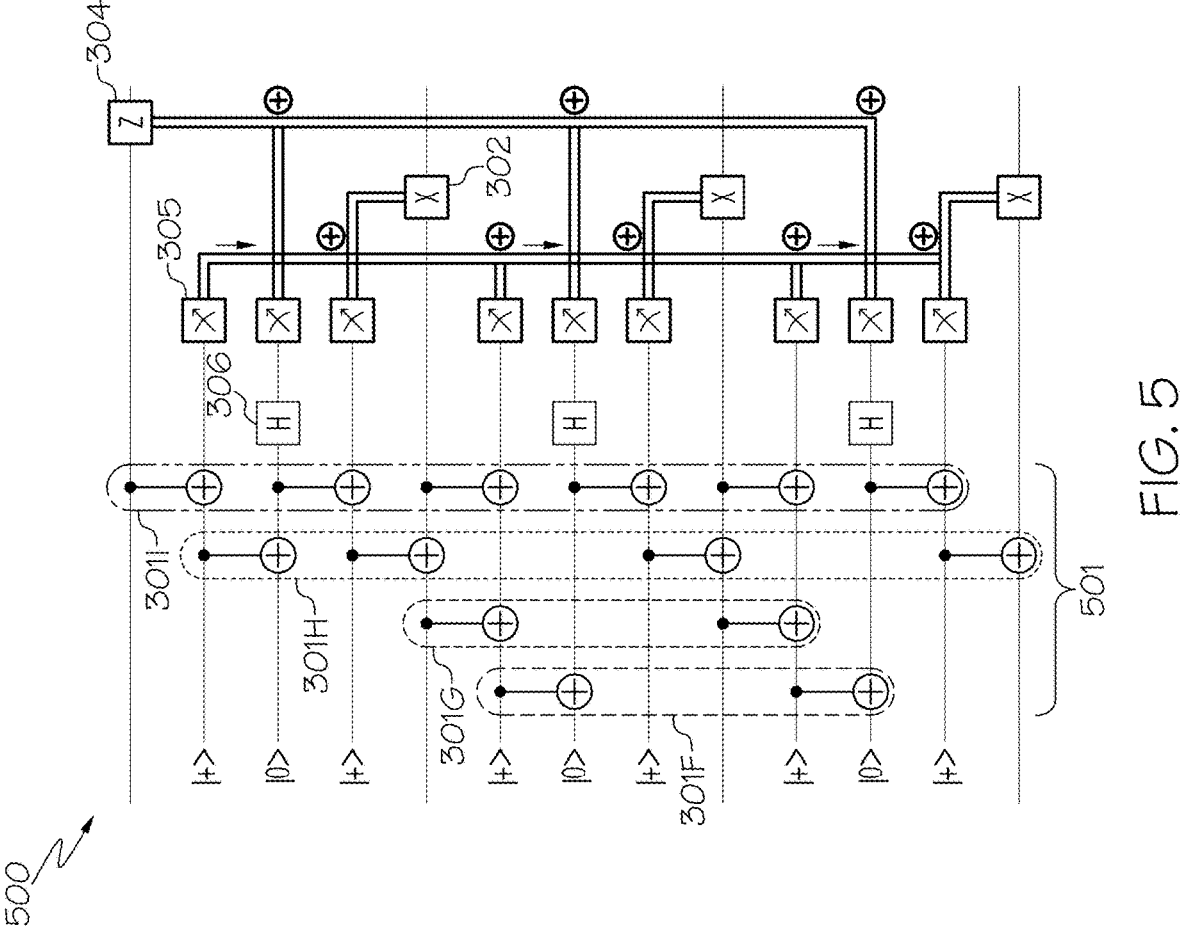
FIG. 5 illustrates a fan-out gate used for implementing the quantum fan-out operation in one round of mid-circuit measurement of the dynamic circuit using 3n ancilla qubits in accordance with an embodiment of the present disclosure.

In one embodiment, if 3n ancilla qubits 303 are utilized as opposed to using n ancilla qubits 303, then the quantum fan-out operation may be implemented by a fan-out gate (e.g., fan-out gate 501) in one round of mid-circuit measurement of the dynamic quantum circuit (e.g., dynamic quantum circuit 500) along with implementing feed-forward operations as shown in FIG. 5.

FIG. 5 illustrates a fan-out gate used for implementing the quantum fan-out operation in one round of mid-circuit measurement of the dynamic circuit using 3n ancilla qubits in accordance with an embodiment of the present disclosure.

Referring to FIG. 5, dynamic quantum circuit 500 includes a fan-out gate 501 that is constructed from ladders 301F-301I of CNOT gates 302, where ladders 301F-301I are functionally similar to ladders 301A-301E. Ladders 301F-301I may collectively or individually be referred to as ladders 301 or ladder 301, respectively.

Dynamic quantum circuit 500 further includes Hadamard gates 306, measurement operations 305, as well as feed-forward operations performed by X gates 502 and Z-gate 304.

In one embodiment, constructing engine 201 is configured to construct a fan-out gate (e.g., fan-out gate 401, 501) using ladders 301 of CNOT gates 302 in a constant depth using a dynamic quantum circuit (e.g., dynamic quantum circuit 500) to perform quantum fan-out operation as discussed above using various software tools, including, but not limited to, Qiskit®, Cirq®, Quantify, etc.

In one embodiment, constructing engine 201 is configured to construct a dynamic quantum circuit that applies the quantum fan-out operation with RZZ operations or arbitrary single-qubit unitaries as discussed below.

Figure 6:
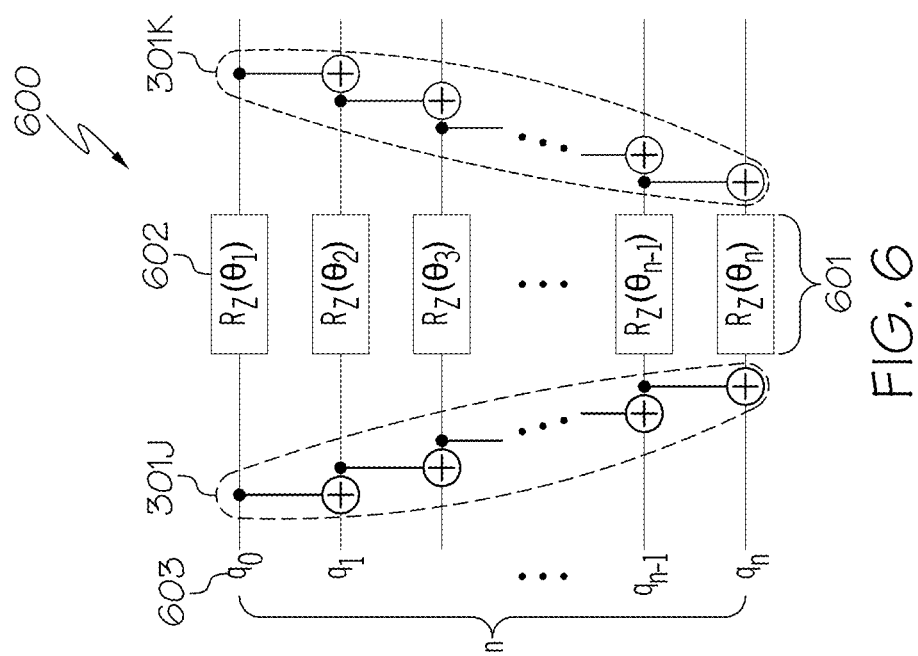
FIG. 6 illustrates applying fan-out with multi-qubit RZZ operations by positioning RZ gates on each qubit between the ladders of CNOT gates in accordance with an embodiment of the present disclosure.

Furthermore, in one embodiment, constructing engine 201 may optionally position RZ gates on each qubit on each side of ladders 301 of CNOT gates 302 thereby applying fan-out with RZZ operations as illustrated in FIG. 6.

FIG. 6 illustrates applying fan-out with multi-qubit RZZ operations by positioning RZ gates on each qubit between the ladders of CNOT gates in accordance with an embodiment of the present disclosure.

As shown in FIG. 6, dynamic quantum circuit 600 includes a fan-out gate 601 formed from ladders 301J-301K of CNOT gates 302. Furthermore, as shown in FIG. 6, RZ gates 602 are positioned on each qubit 603 between ladders 301J-301K of CNOT gates 302 of dynamic quantum circuit 600, where ladders 301J-301K are functionally similar to ladders 301A-301I. Ladders 301J-301K may collectively or individually be referred to as ladders 301 or ladder 301, respectively.

By sandwiching RZ gates 602 on each qubit 603 between ladders 301 of CNOT gates 302 forming fan-out gate 601 in constant depth, the following equation represents the quantum fan-out operation in such an embodiment:

$$\prod_{i=1}^{n} R_{ZZ\ldots Z}(\theta_i)_{q_0, q_1, \ldots, q_i}$$

Figure 7:
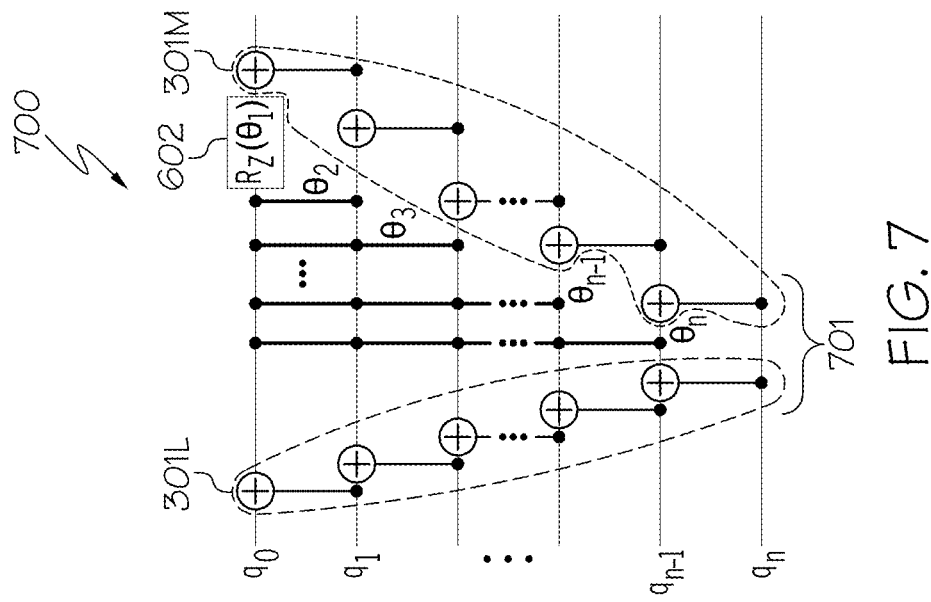
FIG. 7 illustrates applying fan-out with RZZ operations by positioning RZ gates between opposite ladders of CNOT gates in accordance with an embodiment of the present disclosure.

Alternatively, in one embodiment, such RZ gates 602 may be positioned again between opposite CNOT ladders 301 as shown in FIG. 7.

FIG. 7 illustrates applying fan-out with RZZ operations by positioning RZ gates between opposite ladders of CNOT gates in accordance with an embodiment of the present disclosure.

As shown in FIG. 7, dynamic quantum circuit 700 includes a fan-out gate 701 formed from ladders 301L-301M of CNOT gates 302. As further shown in FIG. 7, RZ gates 602 are positioned between opposite CNOT ladders 301L-301M of CNOT gates 302, where ladders 301L-301M are functionally similar to ladders 301A-301K. Ladders 301L-301M may collectively or individually be referred to as ladders 301 or ladder 301, respectively. In constant depth, the following equation represents the quantum fan-out operation in such an embodiment:

$$\prod_{i=1}^{n} R_{ZZ}(\theta_i)_{q_0, q_i}$$

In one embodiment, constructing engine 201 is configured to position RZ gates 602 in the manner discussed above in connection with FIGS. 6-7 using various software tools, including, but not limited to, Qiskit®, Cirq®, Quantify, etc.

Furthermore, in one embodiment, constructing engine 201 may optionally position unitary gates on each side of ladders 302 of CNOT gates 301 thereby applying fan-out with arbitrary single-qubit unitaries as discussed below in connection with FIGS. 8A-8C and 9A-9D.

Figures 8A, 8B, 8C:
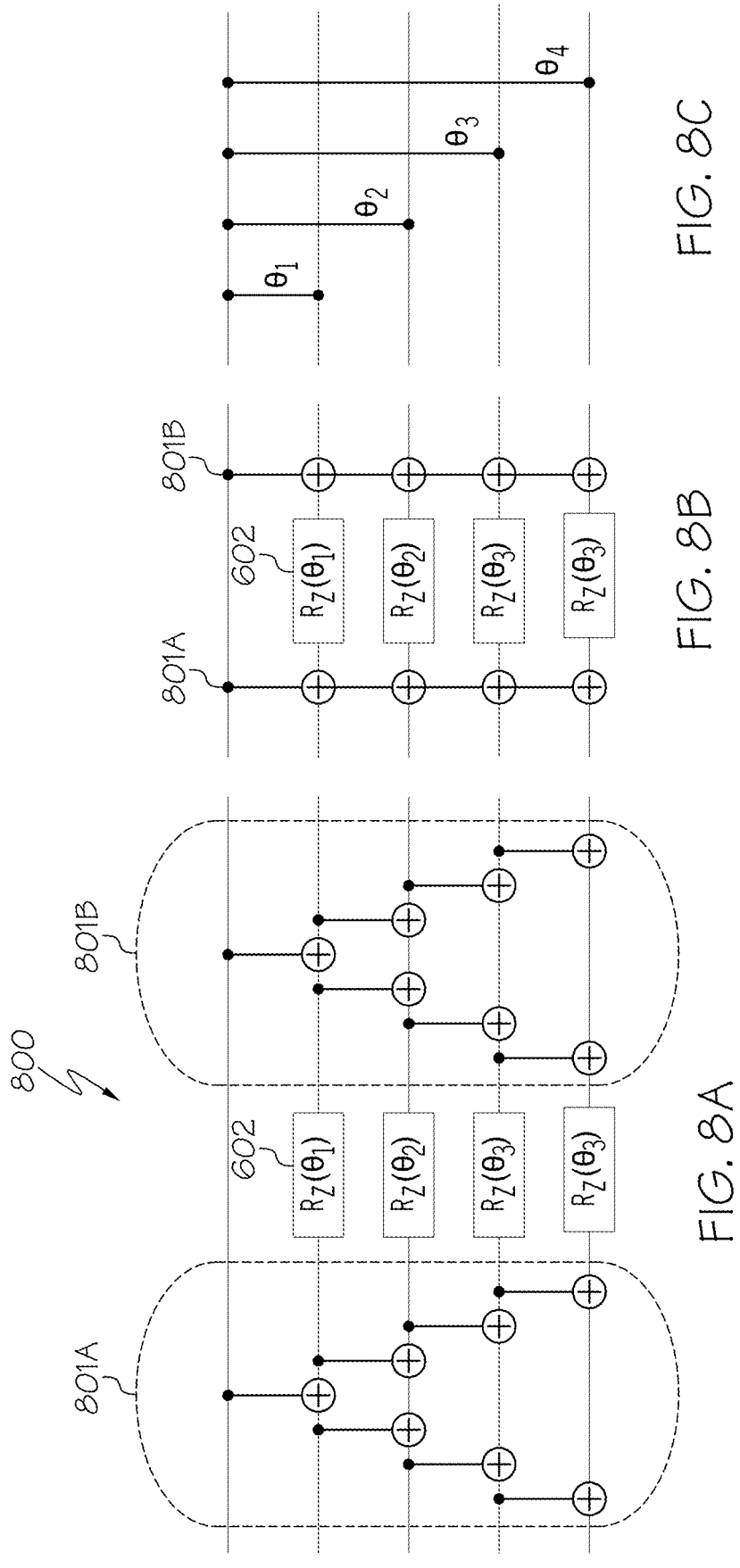
FIGS. 8A-8C illustrate applying fan-out with RZZ operations by positioning RZ gates between two fan-out gates in accordance with an embodiment of the present disclosure.

FIGS. 8A-8C illustrate applying fan-out with RZZ operations by positioning RZ gates between two fan-out gates in accordance with an embodiment of the present disclosure.

Referring to FIG. 8A, RZ gates 602 are positioned between two fan-out gates 801A-801B of dynamic quantum circuit 800. Fan-out gates 801A-801B are functionally similar to fan-out gates 301D-301E, respectively. Fan-out gates 801A-801B may collectively or individually be referred to as fan-out gates 801 or fan-out gate 801, respectively.

Equivalent circuits of dynamic quantum circuit 800 of FIG. 8A are depicted in FIGS. 8B and 8C, where FIG. 8C illustrates fan-out being applied with RZZ operations (multi-qubit rotations) (identified as "$\theta_1 \ldots \theta_4$" in FIG. 8C).

As discussed above, in one embodiment, the depth of the quantum fan-out gates (e.g., fan-out gates 801A-801B) is at constant depth. In constant depth, the following equation represents the quantum fan-out operation in the embodiment of FIGS. 8A-8C:

$$\prod_{i=1}^{n} R_{ZZ}(\theta_i)_{q_0,q_i}$$

In one embodiment, RZ gates 602 in FIG. 8A are replaced with arbitrary unitary gates to implement arbitrary controlled single-qubit gates as discussed below in connection with FIGS. 9A-9D. A controlled unitary gate, as used herein, is a logic gate where the state of one qubit (the control qubit) determines whether a single-qubit unitary operation is applied to a second qubit (the target qubit). An arbitrary controlled unitary gate, as used herein, refers to any randomly selected controlled unitary gate.

FIGS. 9A-9D illustrate applying fan-out with arbitrary single-qubit unitaries by positioning arbitrary controlled single-qubit unitary gates 901 between two fan-out gates in accordance with an embodiment of the present disclosure.

Figures 9A, 9B, 9C, 9D:
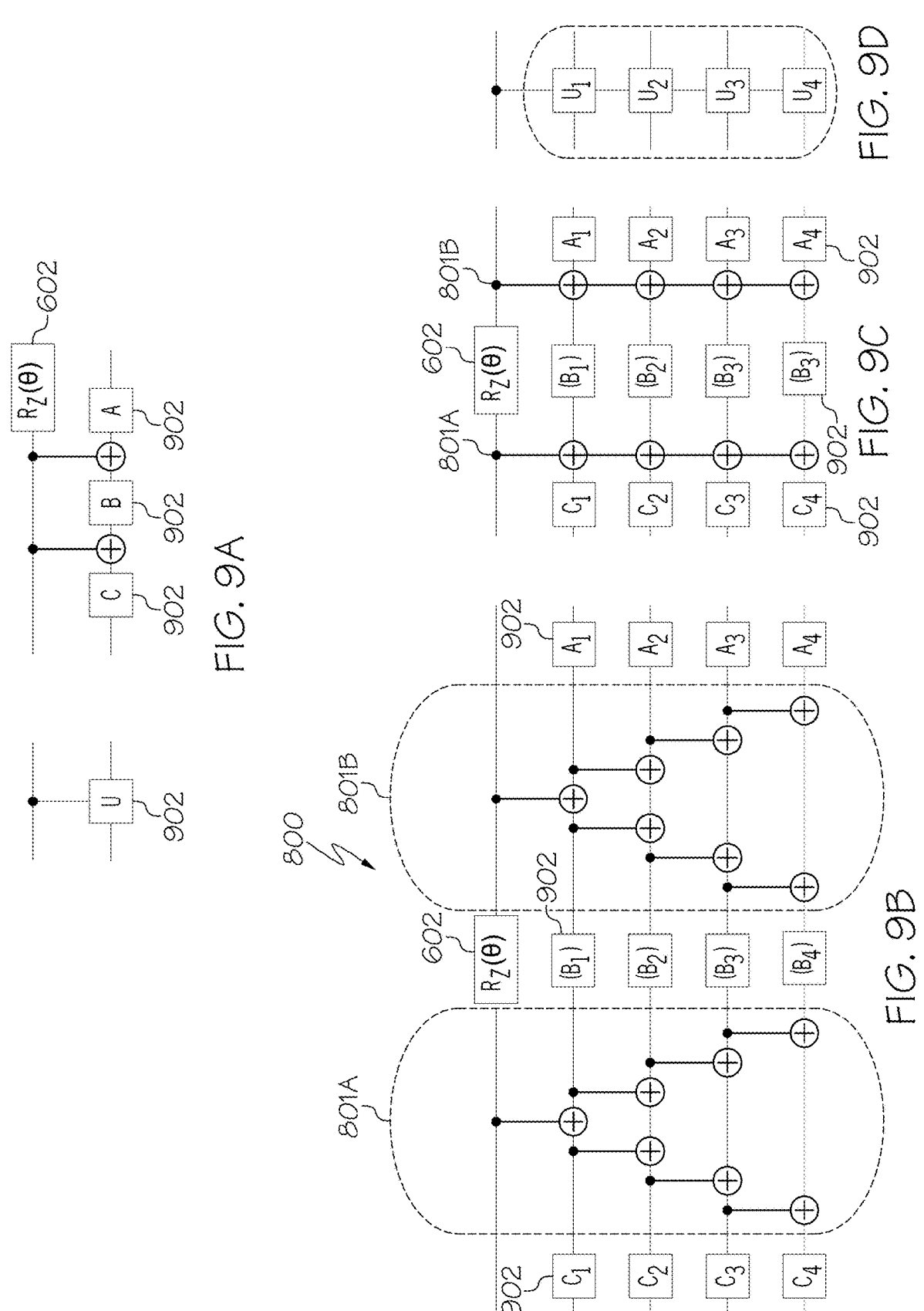
FIGS. 9A-9D illustrate applying fan-out with single qubit unitaries by positioning arbitrary controlled single-qubit unitary gates between two fan-out gates in accordance with an embodiment of the present disclosure.

Referring to FIG. 9A, FIG. 9A illustrates an arbitrary controlled single-qubit unitary gate 901 being decomposed into two CNOT gates, an RZ rotation and three single-qubit unitaries 902 (identified as "A," "B," and "C" in FIG. 9A). Since the RZ gate 602 can be replaced with any unitary gate, and using the fact that any unitary gate (e.g., unitary gate 901) can be decomposed as shown in FIG. 9A, the following dynamic quantum circuit applying fan-out with arbitrary single-qubit unitaries 902 can be constructed as shown in FIG. 9B. "Arbitrary unitaries" 902, as used herein, refer to any randomly selected parallel single-qubit unitary gate.

Referring to FIG. 9B, arbitrary unitaries 902 are positioned on each side of the two fan-out gates 801A-801B of dynamic quantum circuit 800. In this manner, fan-out may be applied with arbitrary single-qubit unitaries.

Equivalent circuits of dynamic quantum circuit 800 of FIG. 9B are depicted in FIGS. 9C and 9D, where FIG. 9D illustrates fan-out being applied with arbitrary unitaries 902 (identified as "$U_1 \ldots U_4$" in FIG. 9D).

As discussed above, in one embodiment, the depth of the quantum fan-out gates (e.g., fan-out gates 801A-801B) is at constant depth. In constant depth, the following equation represents the quantum fan-out operation in the embodiment of FIGS. 9B-9D:

$$\prod_{i=1}^{n}(C - U_i)_{q_0,q_i}$$

In one embodiment, constructing engine 201 is configured to position RZ gates 602 or arbitrary controlled single-qubit unitary gates 901 in the manner discussed above in connection with FIGS. 8A-8C and 9A-9D using various software tools, including, but not limited to, Qiskit®, Cirq®, Quantify, etc.

Classical computer 102 further includes executing engine 202 configured to implement quantum fan-out operation by the constructed fan-out gate using n ancilla qubits 303, where n is the number of qubits, and feed-forward operations (e.g., performed by X gates 502 and Z-gate 304).

Executing engine 202 may utilize various software tools for implementing the quantum fan-out operation discussed above, including, but not limited to, qsim Cirq® simulator, staq, QuEST, QX Simulator, etc.

Furthermore, in one embodiment, executing engine 202 may implement a quantum fan-out operation of the fanout of multi-qubit rotations (RZZ operations from RZ gates 602) as discussed above in connection with FIGS. 8A-8C or arbitrary unitaries (e.g., arbitrary unitaries 902) as discussed above in connection with FIGS. 9A-9D. Executing engine 202 may utilizes various software tools for implementing the quantum fan-out operation in such embodiments, including, but not limited to, qsim Cirq® simulator, staq, QuEST, QX Simulator, etc.

In this manner, the quantum fan-out operation may be implemented on superconducting devices (superconducting qubits) by reducing the depth of the quantum fan-out gate to a constant depth (the depth or number of time steps is independent of the number of qubits) with fewer CNOT gates and using fewer ancilla qubits. Furthermore, fan-out may be applied with arbitrary unitaries or multi-qubit rotations thereby enabling improvement in executing quantum algorithms, such as quantum Fourier transform, quantum phase estimation, the increment gate, sorting, etc. as well as application use cases, such as QAOA (Quantum Approximate Optimization Algorithm), and VQE (Variational-Quantum-Eigensolver) in terms of fidelity, scalability, and speedup.

A further description of these and other functions is provided below in connection with the discussion of the method for implementing quantum fan-out operations on superconducting devices (superconducting qubits) at a reduced depth (constant depth) with fewer CNOT gates using dynamic quantum circuits.

Prior to the discussion of the method for implementing quantum fan-out operations on superconducting devices (superconducting qubits) at a reduced depth (constant depth) with fewer CNOT gates using dynamic quantum circuits, a description of the hardware configuration of classical computer 102 (FIG. 1) is provided below in connection with FIG. 10.

Referring now to FIG. 10, in conjunction with FIG. 1, FIG. 10 illustrates an embodiment of the present disclosure of the hardware configuration of classical computer 102 which is representative of a hardware environment for practicing the present disclosure.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1000 contains an example of an environment for the execution of at least some of the computer code 1001 involved in performing the inventive methods, such as implementing quantum fan-out operations on superconducting devices (superconducting qubits) at a reduced depth (constant depth) with fewer CNOT gates using dynamic quantum circuits. In addition to block 1001, computing environment 1000 includes, for example, classical computer 102, network 113, such as a wide area network (WAN), end user device (EUD) 1002, remote server 1003, public cloud 1004, and private cloud 1005. In this embodiment, classical computer 102 includes processor set 1006 (including processing circuitry 1007 and cache 1008), communication fabric 1009, volatile memory 1010, persistent storage 1011 (including operating system 1012 and block 1001, as identified above), peripheral device set 1013 (including user interface (UI) device set 1014, storage 1015, and Internet of Things (IoT) sensor set 1016), and network module 1017. Remote server 1003 includes remote database 1018. Public cloud 1004 includes gateway 1019, cloud orchestration module 1020, host physical machine set 1021, virtual machine set 1022, and container set 1023.

Classical computer 102 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1018. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically classical computer 102, to keep the presentation as simple as possible. Classical computer 102 may be located in a cloud, even though it is not shown in a cloud in FIG. 10. On the other hand, classical computer 102 is not required to be in a cloud except to any extent as may be affirmatively indicated.

Processor set 1006 includes one, or more, computer processors of any type now known or to be developed in the future. Processing circuitry 1007 may be distributed over multiple packages, for example, multiple, coordinated integrated circuit chips. Processing circuitry 1007 may implement multiple processor threads and/or multiple processor cores. Cache 1008 is memory that is located in the processor chip package(s) and is typically used for data or code that should be available for rapid access by the threads or cores running on processor set 1006. Cache memories are typically organized into multiple levels depending upon relative proximity to the processing circuitry. Alternatively, some, or all, of the cache for the processor set may be located "off chip." In some computing environments, processor set 1006 may be designed for working with qubits and performing quantum computing.

Computer readable program instructions are typically loaded onto classical computer 102 to cause a series of operational steps to be performed by processor set 1006 of classical computer 102 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1008 and the other storage media discussed below. The program instructions, and associated data, are accessed by processor set 1006 to control and direct performance of the inventive methods. In computing environment 1000, at least some of the instructions for performing the inventive methods may be stored in block 1001 in persistent storage 1011.

Communication fabric 1009 is the signal conduction paths that allow the various components of classical computer 102 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1010 is any type of volatile memory now known or to be developed in the future. Examples include dynamic type random access memory (RAM) or static type RAM. Typically, the volatile memory is characterized by random access, but this is not required unless affirmatively indicated. In classical computer 102, the volatile memory 1010 is located in a single package and is internal to classical computer 102, but, alternatively or additionally, the volatile memory may be distributed over multiple packages and/or located externally with respect to classical computer 102.

Persistent Storage 1011 is any form of non-volatile storage for computers that is now known or to be developed in the future. The non-volatility of this storage means that the stored data is maintained regardless of whether power is being supplied to classical computer 102 and/or directly to persistent storage 1011. Persistent storage 1011 may be a read only memory (ROM), but typically at least a portion of the persistent storage allows writing of data, deletion of data and re-writing of data. Some familiar forms of persistent storage include magnetic disks and solid state storage devices. Operating system 1012 may take several forms, such as various known proprietary operating systems or open source Portable Operating System Interface type operating systems that employ a kernel. The code included in block 1001 typically includes at least some of the computer code involved in performing the inventive methods.

Peripheral device set 1013 includes the set of peripheral devices of classical computer 102. Data communication connections between the peripheral devices and the other components of classical computer 102 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1014 may include components such as a display screen, speaker, microphone, wearable devices (such as goggles and smart watches), keyboard, mouse, printer, touchpad, game controllers, and haptic devices. Storage 1015 is external storage, such as an external hard drive, or insertable storage, such as an SD card. Storage 1015 may be persistent and/or volatile. In some embodiments, storage 1015 may take the form of a quantum computing storage device for storing data in the form of qubits. In embodiments where classical computer 102 is required to have a large amount of storage (for example, where classical computer 102 locally stores and manages a large database) then this storage may be provided by peripheral storage devices designed for storing very large amounts of data, such as a storage area network (SAN) that is shared by multiple, geographically distributed computers. IoT sensor set 1016 is made up of sensors that can be used in Internet of Things applications. For example, one sensor may be a thermometer and another sensor may be a motion detector.

Network module 1017 is the collection of computer software, hardware, and firmware that allows classical computer 102 to communicate with other computers through WAN 113. Network module 1017 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1017 are performed on the same physical hardware device. In other embodiments (for example, embodiments that utilize software-defined networking (SDN)), the control functions and the forwarding functions of network module 1017 are performed on physically separate devices, such that the control functions manage several different network hardware devices. Computer readable program instructions for performing the inventive methods can typically be downloaded to classical computer 102 from an external computer or external storage device through a network adapter card or network interface included in network module 1017.

WAN 113 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1002 is any computer system that is used and controlled by an end user (for example, a customer of an enterprise that operates classical computer 102), and may take any of the forms discussed above in connection with classical computer 102. EUD 1002 typically receives helpful and useful data from the operations of classical computer 102. For example, in a hypothetical case where classical computer 102 is designed to provide a recommendation to an end user, this recommendation would typically be communicated from network module 1017 of classical computer 102 through WAN 113 to EUD 1002. In this way, EUD 1002 can display, or otherwise present, the recommendation to an end user. In some embodiments, EUD 1002 may be a client device, such as thin client, heavy client, mainframe computer, desktop computer and so on.

Remote server 1003 is any computer system that serves at least some data and/or functionality to classical computer 102. Remote server 1003 may be controlled and used by the same entity that operates classical computer 102. Remote server 1003 represents the machine(s) that collect and store helpful and useful data for use by other computers, such as classical computer 102. For example, in a hypothetical case where classical computer 102 is designed and programmed to provide a recommendation based on historical data, then this historical data may be provided to classical computer 102 from remote database 1018 of remote server 1003.

Public cloud 1004 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1004 is performed by the computer hardware and/or software of cloud orchestration module 1020. The computing resources provided by public cloud 1004 are typically implemented by virtual computing environments that run on various computers making up the computers of host physical machine set 1021, which is the universe of physical computers in and/or available to public cloud 1004. The virtual computing environments (VCEs) typically take the form of virtual machines from virtual machine set 1022 and/or containers from container set 1023. It is understood that these VCEs may be stored as images and may be transferred among and between the various physical machine hosts, either as images or after instantiation of the VCE. Cloud orchestration module 1020 manages the transfer and storage of images, deploys new instantiations of VCEs and manages active instantiations of VCE deployments. Gateway 1019 is the collection of computer software, hardware, and firmware that allows public cloud 1004 to communicate through WAN 113.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1005 is similar to public cloud 1004, except that the computing resources are only available for use by a single enterprise. While private cloud 1005 is depicted as being in communication with WAN 113 in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1004 and private cloud 1005 are both part of a larger hybrid cloud.

Block 1001 further includes the software components discussed above in connection with FIGS. 2-9 to implement quantum fan-out operations on superconducting devices (superconducting qubits) at a reduced depth (constant depth) with fewer CNOT gates using dynamic quantum circuits. In one embodiment, such components may be implemented in hardware. The functions discussed above performed by such components are not generic computer functions. As a result, classical computer 102 is a particular machine that is the result of implementing specific, non-generic computer functions.

In one embodiment, the functionality of such software components of classical computer 102, including the functionality for implementing quantum fan-out operations on superconducting devices (superconducting qubits) at a reduced depth (constant depth) with fewer CNOT gates using dynamic quantum circuits, may be embodied in an application specific integrated circuit.

As stated above, applications of quantum fan-out include fault-tolerant applications include arithmetic operations, such as addition, OR, and modulus. Furthermore, quantum fan-out can be very powerful for various quantum algorithms and subroutines. Currently, the quantum fan-out operation may be implemented on quantum computing platforms by trapped ions, which offer the possibility to natively implement a fan-out gate. Unfortunately, such a technique is not applicable for superconducting devices. A current technique for implementing the quantum fan-out operation on superconducting devices constructs the quantum fan-out gate using costly ladders of CNOT gates (vertical structures of CNOT gates) with a depth (measure of how many layers of parallel operations need to be executed) linear in n, the number of qubits. If, however, the depth of the quantum fan-out gate could be reduced, such as to a constant depth (the depth or number of time steps is independent of the number of qubits), with fewer CNOT gates, then quantum fan-out becomes more feasible on superconducting devices thereby enabling the quantum fan-out operation to be utilized in state preparation, Hamiltonian simulation, quantum machine learning, and error correction as well as in additional quantum algorithms, such as quantum Fourier transform, quantum phase estimation, the increment gate, and sorting.

The embodiments of the present disclosure provide the means for implementing the quantum fan-out operation on superconducting devices by reducing the depth of the quantum fan-out gate to a constant depth (the depth or number of time steps is independent of the number of qubits) with fewer CNOT gates by using dynamic quantum circuits as discussed below in connection with FIG. 11.

FIG. 11 is a flowchart of a method 1100 for implementing the quantum fan-out operation on superconducting devices (superconducting qubits) in accordance with an embodiment of the present disclosure.

Referring to FIG. 11, in conjunction with FIGS. 1-10, in step 1101, constructing engine 201 of classical computer 102 constructs a fan-out gate using ladders of CNOT gates in a constant depth using a dynamic quantum circuit.

As discussed above, a "fan-out gate," as used herein, refers to a sequence of CNOT gates sharing one control qubit that can be executed at the same time. "Constant depth," as used herein, refers to the depth or number of time steps being independent of the number of qubits. A dynamic quantum circuit, as used herein, is a quantum circuit with mid-circuit measurements and feed-forward classical operations which allows such circuits to be adaptive on-the-fly. A mid-circuit measurement, as used herein, is a quantum measurement at an intermediate point in the quantum circuit as opposed to a measurement at the end point of the quantum circuit thereby allowing dynamic adaptations based on the results. Feed-forward classical operations (or simply referred to herein as "feed-forward operations"), as used herein, refer to the real-time adaptation of the quantum circuits based on earlier measurement outcomes.

A "ladder" of CNOT gates refers to a diagonal structure of CNOT gates that has a depth of n, where n is the number of qubits in the ladder of CNOT gates as illustrated in FIGS. 3A-3C. Embodiments of the present disclosure execute such ladders of CNOT gates with dynamic circuits in a depth that does not scale with n resulting in a vertical structure which is more advantageous. Ancilla qubits, as used herein, refer to the extra qubits used to implement irreversible logical operations. For example, when translating a classical circuit into a quantum circuit, extra qubits are introduced because quantum computers only implement reversible logic. Such extra qubits are referred to as "ancilla" (or ancillary) qubits.

Referring to FIG. 3A, FIG. 3A illustrates a quantum circuit 300A containing a ladder 301A of CNOT gates 302, where each CNOT gate 302 operates on a quantum register consisting of 2 qubits. CNOT gates 302 may collectively or individually be referred to as CNOT gates 302 or CNOT gate 302, respectively. The CNOT gate flips the second qubit (the target qubit) if and only if the first qubit (the control qubit) is $|1\rangle$.

Referring to FIG. 3B, FIG. 3B illustrates a quantum circuit 300B that includes three ladders 301A-301C of CNOT gates 302. Ladders of CNOT gates 302 may collectively or individually be referred to as ladders 301 of CNOT gates 302 or ladder 301 of CNOT gates 302, respectively.

Referring to FIG. 3C, FIG. 3C illustrates a dynamic quantum circuit 300C that measures ancilla qubits 303 in the X-basis (particular qubit computational basis state) and feed-forward Z-gates 304 based on the outcome of all ancilla qubits 303 using measurement operations 305. In the X-basis, the qubit eigenstates states are $|+\rangle$ and $|-\rangle$. Furthermore, as illustrated in FIG. 3C, dynamic quantum circuit 300C includes Hadamard gates 306, which are logic gates that turn a state of $|0\rangle$ or $|1\rangle$ into a superposition of $|0\rangle$ and $|1\rangle$. While FIG. 3C illustrates dynamic quantum circuit 300C measuring ancilla qubits 303 in the X-basis, such a dynamic quantum circuit may be modified to measure ancilla qubits 303 in other basis states, such as the Z-basis, such as by exchanging the Z-basis with the X-basis. In the Z-basis, the qubit eigenstates are the states $|0\rangle$ and $|1\rangle$.

As discussed above, a fan-out gate may be constructed from ladders 301 of CNOT gates 302, such as shown in FIGS. 4A-4D.

Referring to FIG. 4A, FIG. 4A illustrates two ladders 301D-301E of CNOT gates 302 of a dynamic quantum circuit 400A, which are configured similarly to ladders 301A-301C.

Such ladders 301D-301E of CNOT gates 302 may be redrawn as shown in FIGS. 4B and 4C, which are used to construct fan-out gate 401 of a dynamic quantum circuit 400B of FIG. 4D, which consists of ladders 301D-301E of CNOT gates 302. Furthermore, as illustrated in FIG. 4D, the quantum fan-out operation is performed by fan-out gate 401 involving strategically positioned measurement operations 305 and Hadamard gates 306 using ancilla qubits 303.

Furthermore, in one embodiment, by adding an additional ladder 301 of CNOT gates 302 on the qubits to not be utilized by the fan-out gate (e.g., fan-out gate 401), such qubits can be disregarded by the fan-out gate.

In one embodiment, the quantum fan-out operation is implemented by the fan-out gate (e.g., fan-out gate 401) in two rounds of mid-circuit measurements of the dynamic quantum circuit (e.g., dynamic quantum circuit 400B) using n ancilla qubits 303, where n is the number of qubits.

In one embodiment, if 3n ancilla qubits 303 are utilized as opposed to using n ancilla qubits 303, then the quantum fan-out operation may be implemented by a fan-out gate (e.g., fan-out gate 501) in one round of mid-circuit measurement of the dynamic quantum circuit (e.g., dynamic quantum circuit 500) along with implementing feed-forward operations as shown in FIG. 5.

Referring to FIG. 5, dynamic quantum circuit 500 includes a fan-out gate 501 that is constructed from ladders 301F-301I of CNOT gates 302, where ladders 301F-301I are functionally similar to ladders 301A-301E.

Dynamic quantum circuit 500 further includes Hadamard gates 306, measurement operations 305, as well as feed-forward operations performed by X gates 502 and Z-gate 304.

In one embodiment, constructing engine 201 is configured to construct a fan-out gate (e.g., fan-out gate 401, 501) using ladders 301 of CNOT gates 302 in a constant depth using a dynamic quantum circuit (e.g., dynamic quantum circuit 500) to perform quantum fan-out operation as discussed above using various software tools, including, but not limited to, Qiskit®, Cirq®, Quantify, etc.

In step 1102, constructing engine 201 of classical computer 102 optionally positions RZ gates 602 on each qubit 603 between ladders 301 of CNOT gates 302.

For example, as shown in FIG. 6, dynamic quantum circuit 600 includes a fan-out gate 601 formed from ladders 301J-301K of CNOT gates 302. Furthermore, as shown in FIG. 6, RZ gates 602 are positioned on each qubit 603 between ladders 301J-301K of CNOT gates 302 in dynamic quantum circuit 600, where ladders 301J-301K are functionally similar to ladders 301A-301I.

By sandwiching RZ gates 602 on each qubit 603 between ladders 301 of CNOT gates 302 forming fan-out gate 601 in constant depth, the following equation represents the quantum fan-out operation in such an embodiment:

$$\prod_{i=1}^{n} R_{ZZ...Z}(\theta_i)_{q_0, q_1, ..., q_i}$$

Alternatively, in one embodiment, such RZ gates 602 may be positioned again between opposite CNOT ladders 301 as shown in FIG. 7.

For example, as illustrated in FIG. 7, dynamic quantum circuit 700 includes a fan-out gate 701 formed from ladders 301L-301M of CNOT gates 302. As further shown in FIG. 7, RZ gates 602 are positioned between opposite CNOT ladders 301L-301M of CNOT gates 302, where ladders 301L-301M are functionally similar to ladders 301A-301K. In constant depth, the following equation represents the quantum fan-out operation in such an embodiment:

$$\prod_{i=1}^{n} R_{ZZ}(\theta_i)_{q_0, q_i}$$

In one embodiment, constructing engine 201 is configured to position RZ gates 602 in the manner discussed above in connection with FIGS. 6-7 using various software tools, including, but not limited to, Qiskit®, Cirq®, Quantify, etc.

In step 1103, constructing engine 201 of classical computer 102 optionally positions arbitrary unitary gates on each side of ladders 302 of CNOT gates 301.

For example, as discussed above, referring to FIG. 8A, RZ gates 602 are positioned between two fan-out gates 801A-801B of dynamic quantum circuit 800. Fan-out gates 801A-801B are functionally similar to fan-out gates 301D-301E, respectively.

Equivalent circuits of dynamic quantum circuit 800 of FIG. 8A are depicted in FIGS. 8B and 8C, where FIG. 8C illustrates fan-out being applied with RZZ operations (multi-qubit rotations) (identified as "$\theta_1 \ldots \theta_4$" in FIG. 8C).

As discussed above, in one embodiment, the depth of the quantum fan-out gates (e.g., fan-out gates 801A-801B) is at constant depth. In constant depth, the following equation represents the quantum fan-out operation in the embodiment of FIGS. 8A-8C:

$$\prod_{i=1}^{n} R_{ZZ}(\theta_i)_{q_0, q_i}$$

In one embodiment, RZ gates 602 in FIG. 8A are replaced with arbitrary unitary gates to implement arbitrary controlled single-qubit gates as discussed below in connection with FIGS. 9A-9D. A controlled unitary gate, as used herein, is a logic gate where the state of one qubit (the control qubit) determines whether a single-qubit unitary operation is applied to a second qubit (the target qubit). An arbitrary controlled unitary gate, as used herein, refers to any randomly selected controlled unitary gate.

FIGS. 9A-9D illustrate applying fan-out with arbitrary single-qubit unitaries by positioning arbitrary controlled single-qubit unitary gates 901 between two fan-out gates in accordance with an embodiment of the present disclosure.

Referring to FIG. 9A, FIG. 9A illustrates an arbitrary controlled single-qubit unitary gate 901 being decomposed into two CNOT gates, an RZ rotation and three single-qubit unitaries 902 (identified as "A," "B," and "C" in FIG. 9A). Since the RZ gate 602 can be replaced with any unitary gate, and using the fact that any unitary gate (e.g., unitary gate 901) can be decomposed as shown in FIG. 9A, the following dynamic quantum circuit applying fan-out with arbitrary single-qubit unitaries 902 can be constructed as shown in FIG. 9B. "Arbitrary unitaries" 902, as used herein, refer to any randomly selected parallel single-qubit unitary gate.

Referring to FIG. 9B, arbitrary unitaries 902 are positioned on each side of the two fan-out gates 801A-801B of dynamic quantum circuit 800. In this manner, fan-out may be applied with arbitrary single-qubit unitaries.

Equivalent circuits of dynamic quantum circuit 800 of FIG. 9B are depicted in FIGS. 9C and 9D, where FIG. 9D illustrates fan-out being applied with arbitrary unitaries 902 (identified as "$U_1$ . . . . $U_4$" in FIG. 9D).

As discussed above, in one embodiment, the depth of the quantum fan-out gates (e.g., fan-out gates 801A-801B) is at constant depth. In constant depth, the following equation represents the quantum fan-out operation in the embodiment of FIGS. 9B-9D:

$$\prod_{i=1}^{n}(C - U_i)_{q_0,q_i}$$

In one embodiment, constructing engine 201 is configured to position RZ gates 602 or arbitrary controlled single-qubit unitary gates 901 in the manner discussed above in connection with FIGS. 8A-8C and 9A-9D using various software tools, including, but not limited to, Qiskit®, Cirq®, Quantify, etc.

In step 1104, executing engine 202 of classical computer 102 implements the quantum fan-out operation by the constructed fan-out gate using ancilla qubits 303, such as n ancilla qubits, where n is the number of qubits, and feed-forward operations (e.g., performed by X gates 502 and Z-gate 304).

As stated above, executing engine 202 may utilize various software tools for implementing the quantum fan-out operation discussed above, including, but not limited to, qsim Cirq® simulator, staq, QuEST, QX Simulator, etc.

Furthermore, in one embodiment, executing engine 202 may implement a quantum fan-out operation of the fanout of multi-qubit rotations (RZZ operations from RZ gates 602) as discussed above in connection with FIGS. 8A-8C or arbitrary unitaries (e.g., arbitrary unitaries 902) as discussed above in connection with FIGS. 9A-9D. Executing engine 202 may utilizes various software tools for implementing the quantum fan-out operation in such embodiments, including, but not limited to, qsim Cirq® simulator, staq, QuEST, QX Simulator, etc.

In this manner, the quantum fan-out operation may be implemented on superconducting devices (superconducting qubits) by reducing the depth of the quantum fan-out gate to a constant depth (the depth or number of time steps is independent of the number of qubits) with fewer CNOT gates and using fewer ancilla qubits. Furthermore, fan-out may be applied with arbitrary unitaries or multi-qubit rotations thereby enabling improvement in executing quantum algorithms, such as quantum Fourier transform, quantum phase estimation, the increment gate, sorting, etc. as well as application use cases, such as QAOA (Quantum Approximate Optimization Algorithm), and VQE (Variational-Quantum-Eigensolver) in terms of fidelity, scalability, and speed-up.

Furthermore, the principles of the present disclosure improve the technology or technical field involving the quantum fan-out operation.

As discussed above, applications of quantum fan-out include fault-tolerant applications include arithmetic operations, such as addition, OR, and modulus. Furthermore, quantum fan-out can be very powerful for various quantum algorithms and subroutines. Currently, the quantum fan-out operation may be implemented on quantum computing platforms by trapped ions, which offer the possibility to natively implement a fan-out gate. Unfortunately, such a technique is not applicable for superconducting devices. A current technique for implementing the quantum fan-out operation on superconducting devices constructs the quantum fan-out gate using costly ladders of CNOT gates (vertical structures of CNOT gates) with a depth (measure of how many layers of parallel operations need to be executed) linear in n, the number of qubits. If, however, the depth of the quantum fan-out gate could be reduced, such as to a constant depth (the depth or number of time steps is independent of the number of qubits), with fewer CNOT gates, then quantum fan-out becomes more feasible on superconducting devices thereby enabling the quantum fan-out operation to be utilized in state preparation, Hamiltonian simulation, quantum machine learning, and error correction as well as in additional quantum algorithms, such as quantum Fourier transform, quantum phase estimation, the increment gate, and sorting.

Embodiments of the present disclosure improve such technology by constructing a fan-out gate in a constant depth using a dynamic quantum circuit, such as by using ladders of CNOT gates. Constant depth, as used herein, refers to the depth or number of time steps being independent of the number of qubits. A dynamic quantum circuit, as used herein, is a quantum circuit with mid-circuit measurements and feed-forward classical operations which allows such circuits to be adaptive on-the-fly. The quantum fan-out operation is implemented by the fan-out gate using ancilla qubits and feed-forward operations. In this manner, the quantum fan-out operation can be implemented on superconducting devices at a reduced depth (constant depth) with fewer CNOT gates as well as using fewer ancilla qubits. Furthermore, in this manner, there is an improvement in the technical field involving the quantum fan-out operation.

The technical solution provided by the present disclosure cannot be performed in the human mind or by a human using a pen and paper. That is, the technical solution provided by the present disclosure could not be accomplished in the human mind or by a human using a pen and paper in any reasonable amount of time and with any reasonable expectation of accuracy without the use of a computer.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for implementing a quantum fan-out operation, the method comprising:

constructing a fan-out gate using ladders of CNOT gates in a constant depth using a dynamic quantum circuit, wherein each ladder of said ladders of CNOT gates is a diagonal structure of CNOT gates that has a depth of n, where n is a number of qubits in said ladder of CNOT gates; and implementing said quantum fan-out operation by said fan-out gate using ancilla qubits and feed-forward operations.

2. The method as recited in claim 1, wherein said fan-out gate is constructed from two ladders of CNOT gates.

3. The method as recited in claim 1 further comprising:

positioning RZ gates on each qubit between said ladders of CNOT gates thereby applying fan-out with RZZ operations.

4. The method as recited in claim 1 further comprising:

positioning arbitrary unitary gates between said ladders of CNOT gates thereby applying fan-out with arbitrary single-qubit unitaries.

5. The method as recited in claim 1 further comprising:

implementing said quantum fan-out operation by said fan-out gate in one round of mid-circuit measurement of said dynamic quantum circuit using 3n ancilla qubits, where n is a number of qubits.

6. The method as recited in claim 1 further comprising:

implementing said quantum fan-out operation by said fan-out gate in two rounds of mid-circuit measurements of said dynamic quantum circuit using n ancilla qubits, where n is a number of qubits.

7. The method as recited in claim 1, wherein said dynamic quantum circuit has a depth that does not scale with a number of qubits.

8. A computer program product for implementing a quantum fan-out operation, the computer program product comprising one or more computer readable storage mediums having program code embodied therewith, the program code comprising programming instructions for:

constructing a fan-out gate using ladders of CNOT gates in a constant depth using a dynamic quantum circuit, wherein each ladder of said ladders of CNOT gates is a diagonal structure of CNOT gates that has a depth of n, where n is a number of qubits in said ladder of CNOT gates; and implementing said quantum fan-out operation by said fan-out gate using ancilla qubits and feed-forward operations.

9. The computer program product as recited in claim 8, wherein said fan-out gate is constructed from two ladders of CNOT gates.

10. The computer program product as recited in claim 8, wherein the program code further comprises the programming instructions for:

positioning RZ gates on each qubit between said ladders of CNOT gates thereby applying fan-out with RZZ operations.

11. The computer program product as recited in claim 8, wherein the program code further comprises the programming instructions for:

positioning arbitrary unitary gates between said ladders of CNOT gates thereby applying fan-out with arbitrary single-qubit unitaries.

12. The computer program product as recited in claim 8, wherein the program code further comprises the programming instructions for:

implementing said quantum fan-out operation by said fan-out gate in one round of mid-circuit measurement of said dynamic quantum circuit using 3n ancilla qubits, where n is a number of qubits.

13. The computer program product as recited in claim 8, wherein the program code further comprises the programming instructions for:

implementing said quantum fan-out operation by said fan-out gate in two rounds of mid-circuit measurements of said dynamic quantum circuit using n ancilla qubits, where n is a number of qubits.

14. The computer program product as recited in claim 8, wherein said dynamic quantum circuit has a depth that does not scale with a number of qubits.

15. A system, comprising:

a memory for storing a computer program for implementing a quantum fan-out operation; and a processor connected to said memory, wherein said processor is configured to execute program instructions of the computer program comprising:

constructing a fan-out gate using ladders of CNOT gates in a constant depth using a dynamic quantum circuit, wherein each ladder of said ladders of CNOT gates is a diagonal structure of CNOT gates that has a depth of n, where n is a number of qubits in said ladder of CNOT gates; and implementing said quantum fan-out operation by said fan-out gate using ancilla qubits and feed-forward operations.

16. The system as recited in claim 15, wherein said fan-out gate is constructed from two ladders of CNOT gates.

17. The system as recited in claim 15, wherein the program instructions of the computer program further comprise:

positioning RZ gates on each qubit between said ladders of CNOT gates thereby applying fan-out with RZZ operations.

18. The system as recited in claim 15, wherein the program instructions of the computer program further comprise:

positioning arbitrary unitary gates between said ladders of CNOT gates thereby applying fan-out with arbitrary single-qubit unitaries.

19. The system as recited in claim 15, wherein the program instructions of the computer program further comprise:

implementing said quantum fan-out operation by said fan-out gate in one round of mid-circuit measurement of said dynamic quantum circuit using 3n ancilla qubits, where n is a number of qubits.

20. The system as recited in claim 15, wherein the program instructions of the computer program further comprise:

implementing said quantum fan-out operation by said fan-out gate in two rounds of mid-circuit measurements of said dynamic quantum circuit using n ancilla qubits, where n is a number of qubits.

* * * * *